(12) United States Patent
Shimizu et al.

(10) Patent No.: US 9,996,070 B2
(45) Date of Patent: Jun. 12, 2018

(54) PROGRAMMABLE LOGIC CONTROLLER

(71) Applicant: Mitsubishi Electric Corporation, Tokyo (JP)

(72) Inventors: Yoshinobu Shimizu, Tokyo (JP); Tatsuumi Soyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 261 days.

(21) Appl. No.: 14/761,985

(22) PCT Filed: Apr. 3, 2013

(86) PCT No.: PCT/JP2013/060191
§ 371 (c)(1),
(2) Date: Jul. 20, 2015

(87) PCT Pub. No.: WO2014/162534
PCT Pub. Date: Oct. 9, 2014

(65) Prior Publication Data
US 2015/0362901 A1    Dec. 17, 2015

(51) Int. Cl.
*G05B 19/05* (2006.01)
*H05K 7/14* (2006.01)
*G05B 15/02* (2006.01)

(52) U.S. Cl.
CPC ........... *G05B 19/052* (2013.01); *G05B 15/02* (2013.01); *G05B 19/05* (2013.01); *H05K 7/1462* (2013.01); *H05K 7/1465* (2013.01); *G05B 2219/15077* (2013.01); *G05B 2219/15078* (2013.01)

(58) Field of Classification Search
None
See application file for complete search history.

(56) References Cited

U.S. PATENT DOCUMENTS 5,541,810 A * 7/1996 Donhauser ........... G05B 19/054
                                                    361/679.41
6,172,875 B1 * 1/2001 Suzuki .................... G06F 1/183
                                                    361/679.4

(Continued)

FOREIGN PATENT DOCUMENTS

DE   60212935 T2   3/2007
JP   7-200011 A    8/1995
(Continued)

OTHER PUBLICATIONS

Communication dated Oct. 28, 2016 from the Korean Intellectual Property Office in counterpart application No. 10-2015-7026914.
(Continued)

Primary Examiner — Jason Lin
(74) Attorney, Agent, or Firm — Sughrue Mion, PLLC; Richard C. Turner

(57) ABSTRACT

A programmable logic controller includes control units. In the programmable logic controller, the control units are installed in such a manner that side surfaces of adjacent ones of the control units have an interval therebetween. In the programmable logic controller, the control units are configured in such a manner that the interval between the side surfaces of adjacent ones of the control units can be set according to an installation environment of the programmable logic controller.

6 Claims, 4 Drawing Sheets

(56) References Cited

U.S. PATENT DOCUMENTS

| | | | |
|---|---|---|---|
| 6,331,935 B1 * | 12/2001 | Baran .................. | G06F 1/1632 |
| | | | 361/679.41 |
| 6,418,027 B1 | 7/2002 | Suzuki et al. | |
| 6,456,495 B1 | 9/2002 | Wieloch et al. | |
| 6,686,672 B2 * | 2/2004 | Brown .................. | H05K 7/1471 |
| | | | 307/125 |
| 7,761,923 B2 * | 7/2010 | Khuti ..................... | H04L 63/02 |
| | | | 726/11 |
| 2001/0023774 A1 | 9/2001 | Kruse et al. | |
| 2003/0174471 A1 | 9/2003 | Tonello et al. | |
| 2011/0320016 A1 * | 12/2011 | Sugimoto ............ | G05B 19/042 |
| | | | 700/19 |
| 2013/0184840 A1 * | 7/2013 | Chin .................... | H05K 7/1465 |
| | | | 700/83 |

FOREIGN PATENT DOCUMENTS

| | | |
|---|---|---|
| JP | 8-162785 A | 6/1996 |
| JP | 9-218702 A | 8/1997 |
| JP | 2000-148214 A | 5/2000 |
| JP | 2000-222007 A | 8/2000 |
| JP | 2001-77553 A | 3/2001 |
| JP | 2001077553 A * | 3/2001 |
| JP | 2001-127476 A | 5/2001 |
| JP | 2001-273011 A | 10/2001 |
| JP | 2002-26558 A | 1/2002 |
| JP | 2007-249450 A | 9/2007 |
| JP | 2010-92391 A | 4/2010 |
| JP | 2010092391 A * | 4/2010 |
| JP | 2010-102712 A | 5/2010 |
| JP | 2011-154003 A | 8/2011 |
| TW | 592024 B | 6/2004 |

OTHER PUBLICATIONS

Communication dated Nov. 1, 2016, issued by the State Intellectual Property Office of the P.R.C. in corresponding Chinese Application No. 201380075067.5.
Taiwanese Office Action for TW102137649 dated Apr. 10, 2015.
International Search Report for PCT/JP2013/060191 dated May 7, 2013.
Communication dated Jun. 8, 2016 from the German Patent and Trademark Office in counterpart application No. 112013006793.5.
Communication dated Apr. 27, 2017 from the Korean Intellectual Property Office in counterpart application No. 10-2015-7026914.

* cited by examiner

PROGRAMMABLE LOGIC CONTROLLER

CROSS REFERENCE TO RELATED APPLICATIONS

This application is a National Stage of International Application No. PCT/JP2013/060191 filed Apr. 3, 2013, the contents of which are incorporated herein by reference in their entirety.

FIELD

The present invention relates to a programmable logic controller.

BACKGROUND

In the field of factory automation, a building-block type programmable logic controller including a plurality of control units is conventionally used. In the programmable logic controller in which the control units are mounted to a base unit, the mounting positions of the control units are set in such a manner that adjacent ones of the control units are placed with no space therebetween.

In the programmable logic controller, upper limits are set on the ambient temperature during the operation and the altitude of the use place to ensure the proper operation in accordance with a control program. If the operation in an environment exceeding these upper limits is forced, heat is not sufficiently dissipated from a control circuit and the like in the control unit and the programmable logic controller gets into a state in which a malfunction is possibly caused due to overheating.

For example, in a programmable logic controller including control units of reference standard which are designed, assuming a predetermined operating environment, if a configuration modification is applied to enhance the heat dissipation property or suppress the amount of heat generation, the upper limit on the ambient temperature and the upper limit on the altitude can be raised while basic specification of reference standard is maintained. In order to enhance the heat dissipation property, there are measures to be taken such as placing the control units at every other slot in the base unit, adding a unit for applying a forced cooling such as a fan, and adding a heat dissipation device and the like. As a measure to be taken to suppress the amount of heat generation, limiting the function of the control units and the like can be considered.

Furthermore, for example, Patent Literature 1 discloses a housing of a module-type controller in which the housing has an external shape obtained by narrowing the entire portion from the central part of right and left side surfaces that constitute the housing toward the front face side. Patent Literature 1 describes that the heat dissipation property is enhanced by causing air to communicate with an internal space via through holes formed in the side surfaces of the housing.

CITATION LIST

Patent Literature

Patent Literature 1: Japanese Patent Application Laid-open No. 2000-222007

SUMMARY

Technical Problem

When the control units are placed at every other slot to enhance the heat dissipation property, the number of control units that can be mounted on an installation place of a predetermined area is decreased by half. Alternatively, instead of reducing the number of control units, an installation place of twice as large as the area is required. When the function of the control units is limited to suppress the amount of heat generation, the programmable logic controller cannot obtain an originally required proper processing performance of the product of reference standard.

When a unit for applying forced cooling such as a fan is added, a malfunction may occur due to overheating if the forced cooling operation stops due to some failure, and thus a problem of degradation in reliability of the product is caused. When a heat dissipation device is added, another space for fixing the heat dissipation device is required, which enlarges the size of the control units. Furthermore, if the heat dissipation device falls off due to some failure, a malfunction caused by overheating may occur and thus a problem of degradation in the reliability of the product is caused.

In the configuration disclosed in Patent Literature 1, the module-type controllers mounted to the base are arranged with the respective adjacent side surfaces being abutted to each other. In this case, the module-type controllers will face a problem in that each controller is likely to reduce heat transfer from the other adjacent module-type controller.

The present invention has been achieved in view of the above problems and an object of the present invention is to provide a programmable logic controller that can easily provide heat releasing characteristics adapted to an installation environment and that can suppress heat transfer between the control units.

Solution to Problem

In order to solve the aforementioned problems, a programmable logic controller according to one aspect of the present invention includes control units, wherein the control units are installed in such a manner that side surfaces of adjacent ones of the control units have an interval and the interval can be set according to an installation environment of the programmable logic controller.

Advantageous Effects of Invention

The programmable logic controller according to the present invention has a space between adjacent ones of control units without causing the control units to abut on each other at the side surfaces. Placing the control units with a space between adjacent ones of the control units enables suppression of heat transfer between the control units. An installation interval between each of the control units is appropriately set to attain a sufficient heat dissipation property by natural air cooling at an ambient temperature or an altitude supposed to be an installation environment. The programmable logic controller can raise the upper limit on the ambient temperature during the operation or the upper limit on the altitude of the use place without taking a measure to reduce the number of control units to half or developing special specification products for a high heat-resisting property. The programmable logic controller can readily attain the heat dissipation characteristics adapted to an installation environment as a configuration in which the control units as standard products are provided. Accordingly, heat releasing characteristics adapted to an installation environment can be easily provided and heat transfer between the control units can be suppressed.

DESCRIPTION OF EMBODIMENTS

Exemplary embodiments of a programmable logic controller according to the present invention will be explained below in detail with reference to the accompanying drawings. The present invention is not limited to the embodiments.

First Embodiment

Figure 1:
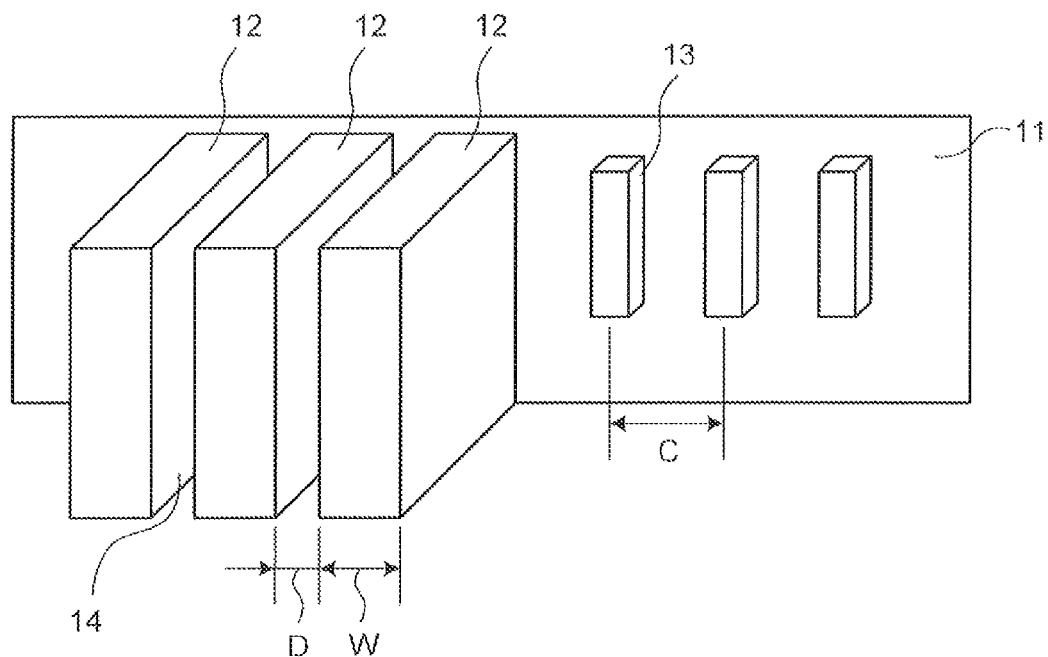
FIG. 1 is a diagram illustrating a schematic configuration of a programmable logic controller according to a first embodiment of the present invention.

FIG. 1 is a diagram illustrating a schematic configuration of a programmable logic controller according to a first embodiment of the present invention. The programmable logic controller includes a plurality of control units 12 and a base unit 11. The control units 12 are mounted to the base unit 11.

The control units 12 control a control target device according to a sequence program. The control units 12 are, for example, products of reference standard. The products of reference standard indicate general products, the design, the development, and the mass production system of which are already provided. Each of the control units 12 has a cuboid external shape.

The base unit 11 has connectors 13 mounted thereon. Each of the connectors 13 connects a terminal on back face of each of the control units 12 to a printed circuit board of the base unit 11. The connectors 13 are provided respectively for the control units 12 to be mounted to the base unit 11.

On the base unit 11, mounting positions of the control units 12 are set in such a manner that side surfaces 14 of the control units 12 adjacently mounted to each other have an interval therebetween. The interval between the side surfaces 14 of adjacent ones of the control units 12 is assumed to be D. When a width of each of the control units 12 in a horizontal direction in which the control units 12 are arrayed in parallel is W, the relation of D<W holds.

Temperature in the housing of each of the control units 12 increases due to heat generation of various parts caused along with the driving thereof. By placing adjacent ones of the control units 12 with an interval therebetween, heat dissipation from the side surfaces 14 of the control units 12 is facilitated by air convection in each space between the control units 12. In the programmable logic controller, sufficient heat dissipation of the control units 12 due to natural air cooling can be attained. Furthermore, by arranging the adjacent ones of the control units 12 not to abut on each other at the side surfaces 14 in the programmable logic controller, heat transfer between the control units 12 can be suppressed.

It is assumed that the interval D can be set according to an installation environment of the programmable logic controller. While a larger interval D can enhance heat dissipation property, the number of control units 12 that can be mounted to the predetermined base unit 11 in the programmable logic controller is reduced.

Assuming that a case where the control units 12 are placed without any interval between the side surfaces 14 thereof is an initial state and the initial state is changed to place the control units 12 at every other slot, at this time, the interval D between the control units 12 is equal to the width W of the control units 12 (D=W). In this case, the number of the control units 12 that can be mounted to the base unit 11 of a predetermined area is decreased by half as compared to the initial state. Instead of decreasing the number of control units by half, the base unit 11 of an area twice or more than twice as large as the area of the initial state is required.

In contrast, in the programmable logic controller according to the present embodiment, the interval between the control units 12 is set smaller than that in the case where the control units 12 are placed at every other slot as described above (D<W). Accordingly, the reduction in the number of the control units 12 that can be mounted to the base unit 11 or the increase in the area of the base unit 11 can be suppressed.

It is assumed that the control units 12 as the products of reference standard ensure a proper operation in a predetermined environment even when the control units 12 are placed with no space between adjacent ones of the control units 12. If the programmable logic controller in which the control units 12 are placed with no space therebetween is used in an environment at a higher temperature or in a place at a higher altitude than the predetermined environment, heat dissipation of the control units 12 may be insufficient, and the programmable logic controller is likely to be in a state where a malfunction possibly occurs due to overheating.

According to the present invention, when it is assumed that the installation environment of the programmable logic controller has a higher temperature than the predetermined environment in which the operation of the product of reference standard is ensured, the interval D corresponding to the assumed temperature increase with respect to the predetermined environment is set. Even in an environment in which a higher heat dissipation property is required than in a case of installation in a predetermined environment, by appropriately adjusting the interval D at which the control units 12 are placed, the programmable logic controller is enabled to perform a proper operation due to a sufficient temperature reducing effect.

Figure 2:
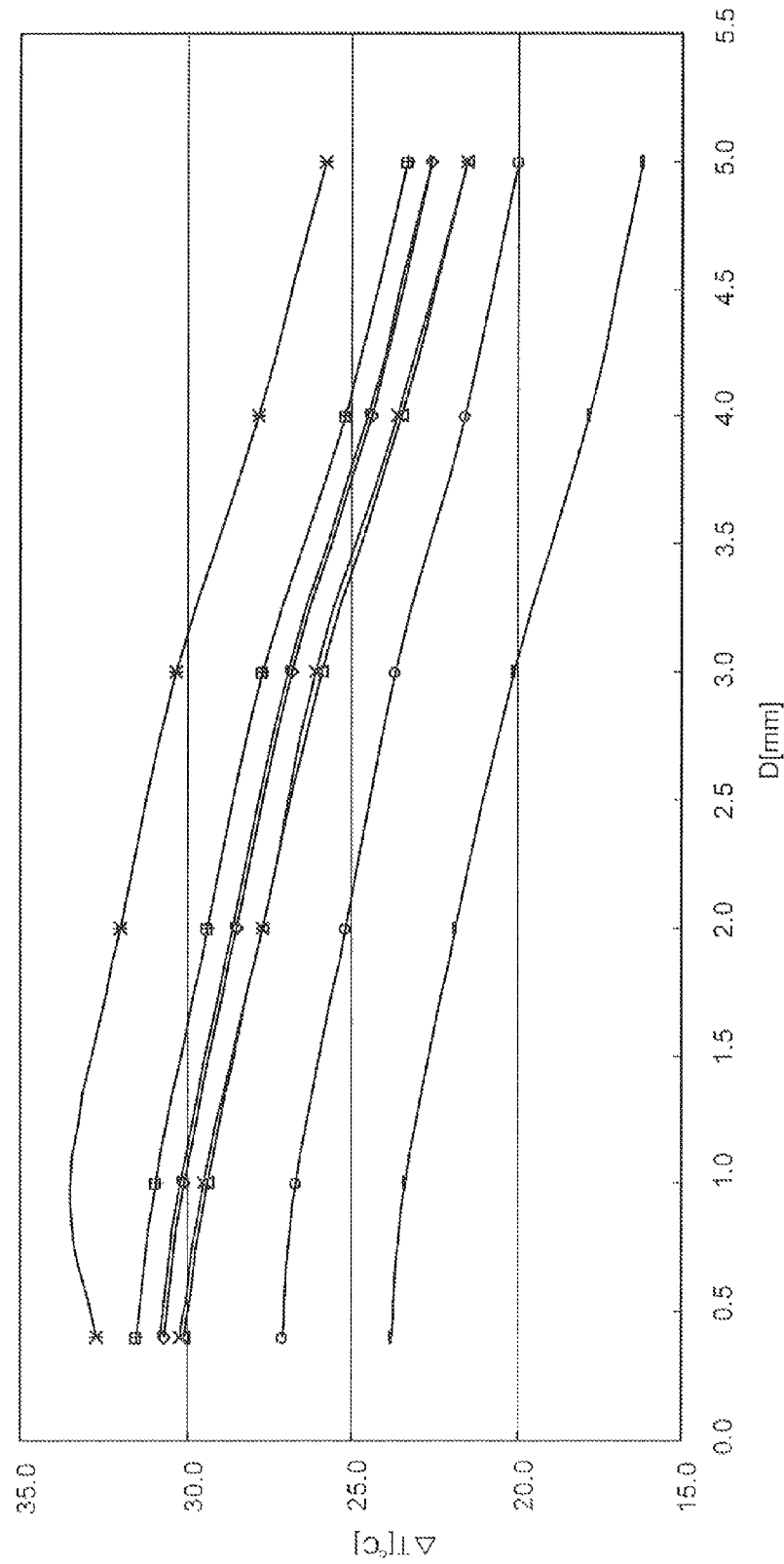
FIG. 2 is a diagram illustrating an example of a relation between the interval between control units and the temperature increase of parts in the control units.

FIG. 2 is a diagram illustrating an example of a relation between the interval between the control units and the temperature increase of parts in the control units. In FIG. 2, the relation between the interval D (millimeter) and the temperature increase $\Delta T$ (° C.) is illustrated regarding eight parts in the control unit 12. Explanations of the parts in the control units 12 are omitted here.

Concerning any of these parts, when the interval D increases, the temperature increase $\Delta T$ decreases. According to the example illustrated in FIG. 2, it can be said that characteristics of changes in the temperature increase $\Delta T$ with respect to the interval D are almost identical among all the parts. As the interval D increases by 1 millimeter, the temperature increase ΔT decreases at a ratio of about 2° C.

According to this relation, when the operation temperature becomes 5° C. higher than the predetermined environment that ensures the operation in a certain configuration, sufficient heat release of the control units 12 can be expected by enlarging the interval D for about 3 millimeters larger than that in the initial configuration.

The connectors 13 are placed according to the interval between the control units 12 set according to the installation environment. A distance C between central positions of the adjacent connectors 13 in the horizontal direction in which the control units 12 are arranged in parallel is a length obtained by adding the interval D to the width W of the control units 12 (C=D+W).

If the control units 12 are placed at every other slot in the initial state as described above, the distance C is equal to twice the width W (C=2×W). In this case, the interval D between the control units 12 is equal to the width W of each of the control units 12 (D=W).

In contrast, in the programmable logic controller according to the present embodiment, the interval between the control units 12 is set smaller than that in the case in which the control units 12 are set at every other slot as described above, in which the interval D is smaller than the width W of the control units 12 (D<W). The distance C is larger than the width W of one of the control units 12 and is smaller than twice the width W (W<C<2×W). Accordingly, reduction in the number of the control units 12 that can be mounted to the base unit 11 or increase in the area of the base unit 11 can be suppressed.

Figure 3:
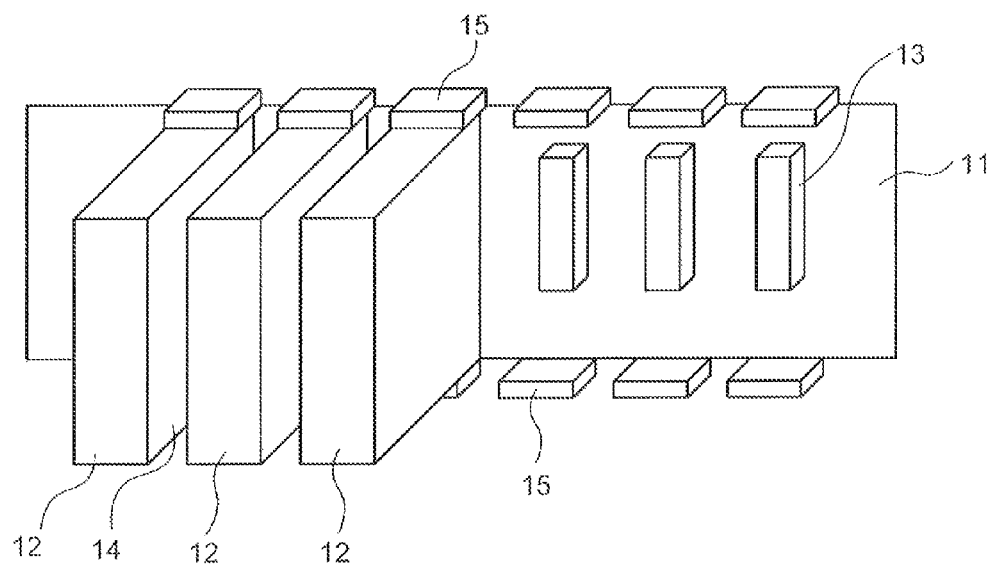
FIG. 3 is a diagram illustrating an example including fixing devices that fix the control units.

FIG. 3 is a diagram illustrating an example including fixing devices that fix the control units. Fixing devices 15 are provided for each of the control units 12 mounted to the base unit 11. A pair of upper and lower fixing devices 15 is mounted respectively at the installation positions of the control units 12 with the base unit 11 interposed therebetween. The upper and lower fixing devices 15 fix upper and lower surfaces of the corresponding control unit 12 to the base unit 11, respectively. Similarly to the case of connectors 13, the fixing devices 15 are placed according to the interval between the control units 12 that are set in accordance with the installation environment.

As described above, the programmable logic controller can readily attain heat dissipation characteristics adapted to an installation environment with a simple measure of adjusting the interval between the control units 12 mounted to the base unit 11. The programmable logic controller can raise the upper limit on the ambient temperature during the operation or the upper limit on the altitude of the use place without taking a measure to reduce the number of control units 12 to half or developing special-specification products with high heat-resisting property. The programmable logic controller can easily attain the heat dissipation characteristics adapted to the installation environment, and can suppress heat transfer between the control units 12 as a configuration in which the control units 12 as products of reference standard are provided.

Second Embodiment

Figure 4:
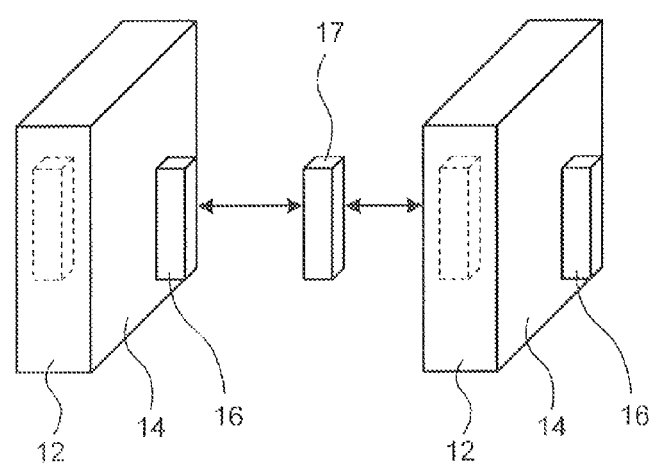
FIG. 4 is a diagram illustrating a schematic configuration of a programmable logic controller according to a second embodiment of the present invention.

FIG. 4 is a diagram illustrating a schematic configuration of a programmable logic controller according to a second embodiment of the present invention. The programmable logic controller according to the second embodiment has connectors that connect control units 12 to each other instead of the base unit 11 in the first embodiment. Parts identical to those in the first embodiment are denoted by the same reference signs and redundant descriptions thereof will be appropriately omitted.

First connectors 16 are connectors fixed to the control units 12. The first connectors 16 are mounted to the right and left side surfaces 14 of the control units 12, respectively. The first connectors 16 have an identical configuration to that of connectors used to couple the control units 12 with each other in a conventional configuration.

Second connectors 17 are connectors that connect the first connectors 16 fixed to adjacent ones of the control units 12 to each other. Each of the second connectors 17 defines an interval at which the control units 12 are placed, together with the first connectors 16. In FIG. 4, the control units 12 to which the first connectors 16 are mounted and the second connector 17 are illustrated in a separated manner.

The first connectors 16 and the second connector 17 are located between the side surfaces 14 of the control units 12 adjacent to each other. The second connector 17 can set the interval at which the control units 12 are placed, together with the first connectors 16 according to the installation environment.

Provision of the first connectors 16 and the second connectors 17 enables the control units 12 to be installed in such a manner that the side surfaces 14 have an interval therebetween. The programmable logic controller can suppress heat transfer between the control units 12 by preventing adjacent ones of the control units 12 from abutting on each other at the respective side surfaces 14, similarly to the first embodiment.

Similarly to the first embodiment, by appropriately adjusting the interval at which the control units 12 are placed, the programmable logic controller can perform proper operation due to a sufficient temperature reducing effect. The programmable logic controller can easily attain heat dissipation characteristics adapted to an installation environment due to a simply measure to adjust the interval between the control units 12 using the first connectors 16 and the second connectors 17. The programmable logic controller can easily provide heat releasing characteristics adapted to the installation environment and can suppress heat transfer between the control units 12 in a configuration in which the control units 12 as the standard products are provided.

Third Embodiment

Figure 5:
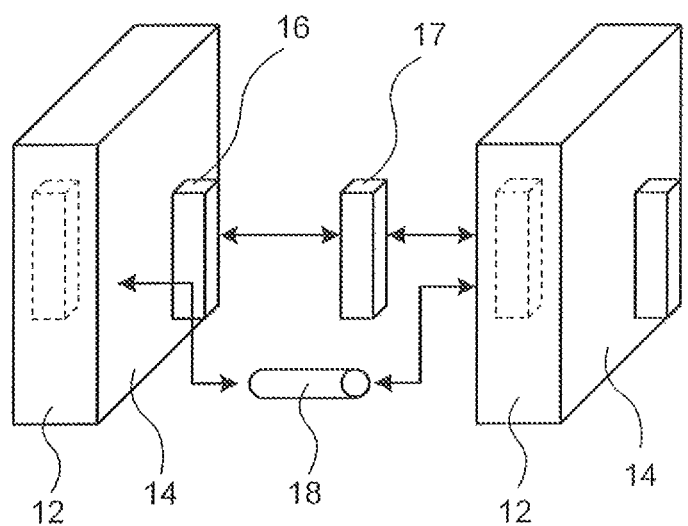
FIG. 5 is a diagram illustrating a schematic configuration of a programmable logic controller according to a third embodiment of the present invention.

FIG. 5 is a diagram illustrating a schematic configuration of a programmable logic controller according to a third embodiment of the present invention. The programmable logic controller according to the third embodiment has fixing devices 18 in addition to the configuration according to the second embodiment. Parts identical to those in the second embodiment are denoted by the same reference signs and redundant descriptions thereof will be appropriately omitted.

The fixing devices 18 fix the side surfaces 14 of adjacent ones of the control units 12 to each other. The fixing devices 18 and the second connectors 17 are used in pairs, respectively. Provision of the fixing devices 18 enables the programmable logic controller to suppress falling off of the control units 12 caused by vibration or the like.

Similarly to the first and second embodiments, the programmable logic controller can easily attain heat dissipation characteristics adapted to the installation environment and can suppress heat transfer between the control units 12 in a configuration in which the control units 12 as the products of reference standard are provided.

REFERENCE SIGNS LIST

11 base unit, 12 control unit, 13 connector, 14 side surface, 15 fixing device, 16 first connector, 17 second connector, 18 fixing device.

The invention claimed is:
1. A programmable logic controller comprising:
control units; and
a base unit to which the control units are mounted, wherein
  connectors that connect the control units to the base unit are mounted on the base unit,
  the control units are mounted to the base unit such that side surfaces of adjacent ones of the control units have an interval,
  the connectors are arranged in such a manner that the control units have the interval set according to an installation environment of the programmable logic controller, and
  the control units are electrically connected to each other and mounted horizontally on the base unit,
wherein a distance between positions of the connectors in a direction in which the control units are arranged in parallel is larger than a width of each of the control units in the direction and is smaller than twice the width.

2. The programmable logic controller according to claim 1, further including fixing devices that fix the control units to the base unit, wherein
  the fixing devices are provided to each of the control units, and are placed to match with the interval set according to the installation environment.

3. The programmable logic controller according to claim 2,
wherein each of the control units comprises:
  a backside facing the base unit; and
  an upper surface and a lower surface perpendicular to the backside, and
wherein the fixing devices comprise:
  upper fixing devices fixing the upper surfaces of the respective control units to the base unit, and
  lower fixing devices fixing the lower surfaces of the respective control units to the base unit.

4. A programmable logic controller comprising:
control units; and
connectors that are mounted to side surfaces of the control units and electrically connect the control units to each other, wherein
the control units are placed such that side surfaces of adjacent ones of the control units have an interval, and
the connectors couple the control units with each other in such a manner that the control units have the interval set according to an installation environment of the programmable logic controller,
wherein the interval between the adjacent ones of the control units is larger than a width of each of the control units and is smaller than twice the width.

5. The programmable logic controller according to claim 4, wherein the connectors include
  first connectors fixed to the control units, and
  second connectors that connect the first connectors fixed to adjacent ones of the control units to each other,
wherein the second connectors are respectively disposed in the intervals.

6. The programmable logic controller according to claim 4, further including fixing devices that fix adjacent ones of the control units to each other.

* * * * *